United States Patent
Akhavain et al.

(10) Patent No.: US 6,983,539 B2
(45) Date of Patent: Jan. 10, 2006

(54) METHOD OF FORMING AN ELECTRICAL CONNECTION BETWEEN ELECTRICAL LEADS OF A TAB CIRCUIT AND ELECTRICAL CONTACT BUMPS

(75) Inventors: Mohammad Akhavain, Escondido, CA (US); Ghassem Azdasht, Berlin (DE)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 10/161,472

(22) Filed: Jun. 3, 2002

(65) Prior Publication Data

US 2003/0041455 A1    Mar. 6, 2003

Related U.S. Application Data

(63) Continuation of application No. 08/843,492, filed on Apr. 16, 1997, now Pat. No. 6,397,465, which is a continuation of application No. 08/558,567, filed on Oct. 1, 1995.

(51) Int. Cl.
*B21D 53/76* (2006.01)
*B23K 26/00* (2006.01)

(52) U.S. Cl. .................... 29/890.1; 29/860; 29/843; 219/121.63; 219/121.64; 228/180.22; 228/234.1

(58) Field of Classification Search ............. 29/890.1, 29/611, 25.35, 840, 843, 860; 219/121.63, 219/121.64; 228/180.22, 208, 209, 212, 228/234.1; 347/63; 438/118, 119, 435; 257/766, 780
See application file for complete search history.

(56) References Cited

U.S. PATENT DOCUMENTS

| 4,845,335 A | 7/1989 | Andrews et al. ....... 219/121.63 |
| 4,978,835 A * | 12/1990 | Luijtjes et al. ......... 219/121.64 |
| 5,008,512 A | 4/1991 | Spletter et al. ........ 219/121.64 |
| 5,164,566 A | 11/1992 | Spletter et al. ........ 219/121.63 |
| 5,278,584 A * | 1/1994 | Keefe et al. ................... 347/63 |

FOREIGN PATENT DOCUMENTS

| DE | 42 00 492 | 4/1993 |
| JP | 6-310846 | * 11/1994 |
| WO | 95/00283 | 1/1995 |

OTHER PUBLICATIONS

Zakel et al, "Investigations of Laser Soldered TAB Inner Lead Contacts", Electronic Components and Technology Conference, 41$^{st}$ Proceedings, May 1991, pp. 497-506.*

* cited by examiner

*Primary Examiner*—A. Dexter Tugbang

(57) ABSTRACT

In one form of the invention, a laser beam propagates directly through bulk material of a TAB tape or base, to heat and form a bond between electrical leads formed on the base and aligned contact bumps. In another form, a chromium seed-metal layer is formed on a TAB tape or base, and leads are in turn formed on the chromium; the chromium absorbs a laser beam to heat the leads. In both forms, an optical fiber preferably presses copper leads and gold bumps together with over 300 g force, without aid by a gas stream—and then also conducts the beam to the bond site, forming a bond of shear strength over 200 g. Also preferably gold contacts are plated on the leads; and the method makes an inkjet printhead—with the bumps formed on a die or other printhead component, and nozzles formed through the base.

9 Claims, 17 Drawing Sheets

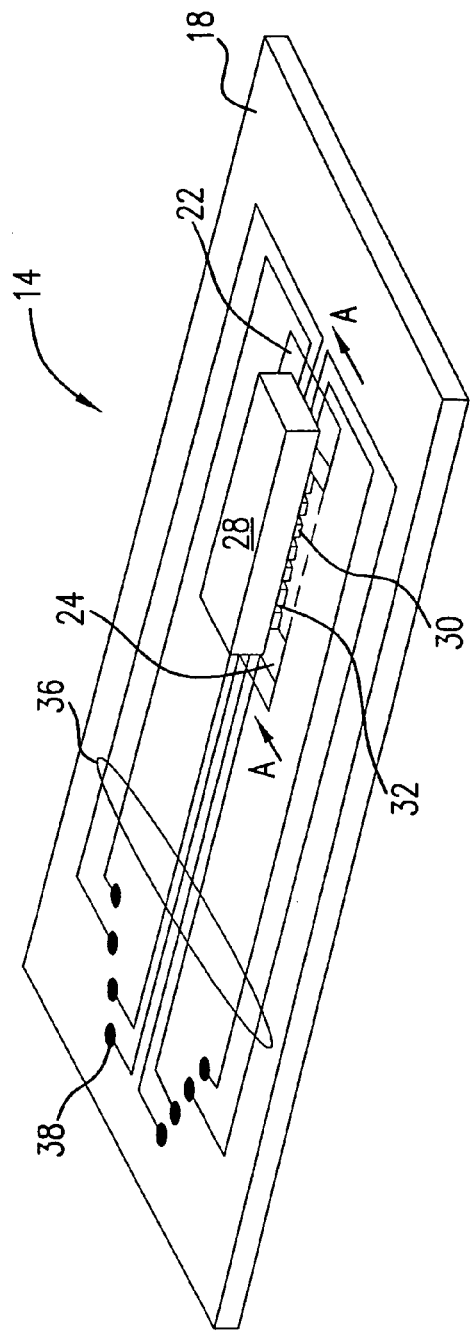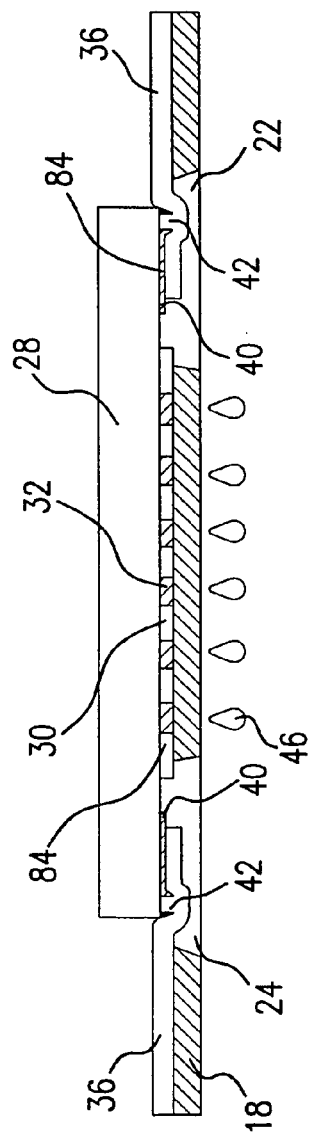
FIG. 5
FIG. 6 PRIOR ART

METHOD OF FORMING AN ELECTRICAL CONNECTION BETWEEN ELECTRICAL LEADS OF A TAB CIRCUIT AND ELECTRICAL CONTACT BUMPS

CROSS REFERENCE TO RELATED APPLICATIONS

This is a divisional application of Ser. No. 08/843,492, filed Apr. 16, 1997, and issued as U.S. Pat. No. 6,397,465; and which was in turn a continuing application of Ser. No. 08/558,567, filed Oct. 1, 1995.

This application relates to the subject matter disclosed in the following U.S. Patents and co-pending U.S. Applications:

U.S. Pat. No. 5,442,384, entitled "Integrated Nozzle Member and TAB Circuit for Inkjet Printhead;" and U.S. Pat. No. 5,278,584, entitled "Ink Delivery System for an Inkjet Printhead;"

The above patent and co-pending applications are assigned to the present assignee and are incorporated herein by reference.

FIELD OF THE INVENTION

The present invention generally relates to the electrical connection of two elements and, more particularly, to the preferably solderless connection of two preferably like metallic elements, preferably using an optical fiber that holds the electrical elements in contact while directing a laser emission to the location to be bonded.

BACKGROUND OF THE INVENTION

Thermal inkjet print cartridges operate by rapidly heating a small volume of ink to cause the ink to vaporize and be ejected through one of a plurality of orifices so as to print a dot of ink on a recording medium, such as a sheet of paper. The properly sequenced ejection of ink from each orifice causes characters or other images to be printed upon the paper as the printhead is moved relative to the paper.

An inkjet printhead generally includes: (1) ink channels to supply ink from an ink reservoir to each vaporization chamber proximate to an orifice; (2) a metal orifice plate or nozzle member in which the orifices are formed in the required pattern; and (3) a silicon substrate containing a series of thin film resistors, one resistor per vaporization chamber.

To print a single dot of ink, an electrical current from an external power supply is passed through a selected thin film resistor. The resistor is then heated, in turn superheating a thin layer of the adjacent ink within a vaporization chamber, causing explosive vaporization, and, consequently, causing a droplet of ink to be ejected through an associated orifice onto the paper.

In U.S. application Ser. No. 07/862,668, filed Apr. 2, 1992, entitled "Integrated Nozzle Member and TAB Circuit for Inkjet Printhead," a novel nozzle member for an inkjet print cartridge and method of forming the nozzle member are disclosed. This integrated nozzle and tab circuit design is superior to the orifice plates for inkjet printheads formed of nickel and fabricated by lithographic electroforming processes. A barrier layer includes vaporization chambers, surrounding each orifice, and ink flow channels which provide fluid communication between an ink reservoir and the vaporization chambers. A flexible tape having conductive traces formed thereon has formed in it nozzles or orifices by excimer laser ablation. By providing the orifices in the flexible circuit itself, the shortcomings of conventional electroformed orifice plates are overcome. The resulting nozzle member having orifices and conductive traces may then have mounted on it a substrate containing heating elements associated with each of the orifices. Additionally, the orifices may be formed aligned with the conductive traces on the nozzle member so that alignment of electrodes on a substrate with respect to ends of the conductive traces also aligns the heating elements with the orifices. The leads at the end of the conductive traces formed on the back surface of the nozzle member are then connected to the electrodes on the substrate and provide energization signals for the heating elements. The above procedure is known as Tape Automated Bonding ("TAB") of an inkjet printhead assembly, or TAB Head Assembly, (hereinafter referred to as a "THA")

An existing solution for connecting the conductive traces formed on the back surface of the nozzle member to the electrodes on the substrate for a THA requires a flexible TAB circuit with a window in the Kapton tape. This window provides an opening for the bonder head, which permits direct contact of the thermode (single point or gang) with the TAB leads. Therefore, the attachment process is performed without direct contact between the thermode and Kapton tape. A TAB bonder thermode comes in direct contact with the flex circuit copper TAB leads through this window. The thermode provides the thermal compression force required to connect the TAB conductive leads to the printhead substrate electrode. Alternatively, an ultrasonic method may be used to connect the TAB conductive leads to the printhead substrate electrode. This window is then filled with an encapsulation material to minimize damage to the conductive leads, shorting, and current leakage. This encapsulation material may flow into the nozzles and cause blockages. Therefore, the Tab Head Assembly ("THA") is designed in a manner that allows a 0.50 to 0.75 mm gap between the edge of the encapsulation and the nozzles. This increases the substrate size by 1 to 1.5 mm. The encapsulation material also creates an indentation that is not desirable for serviceability, and creates coplanarity, and reliability problems.

Accordingly, it would be advantageous to have a process that eliminates the need for a window in the TAB circuits. The elimination of the window would result in elimination of the need for an encapsulation material to cover the conductive leads in the TAB circuit. This in turn would result in die size reduction (or increased number of nozzles with the same die size), ease of assembly, higher yields, improved reliability, ease of surface serviceability, and overall material and manufacturing cost reduction.

SUMMARY OF THE INVENTION

The present invention provides a method for the solderless electrical connection of two contact elements by using a laser light beam attached to a fiber optic system which directs the light to the spot to be bonded. Through use of a fiber optic system the laser beam is optimally converted into thermal energy, and bad connections due to underheating or destruction of the contacts due to overheating do not occur. The method and apparatus provide rapid, reproducible bonding even for the smallest of contact geometries. For example, the method of the invention results in solderless gold-to-gold compression bonding of conductive leads contained in a polymer flex circuit tape, such as a polyimide, without damaging the tape. A strong solderless gold-to-gold bond can be formed between the gold-plated copper lead on the flex circuit tape and a gold-plated pad on a semiconductor chip without the need for a window in the flex circuit and without any damage to the tape.

In the application of the present invention to the bonding of conductive leads on a TAB circuit to the silicon substrate of an inkjet printhead the need for a window in the TAB circuit is eliminated. The elimination of the window results in elimination of the need for an encapsulation material to cover the conductive leads in the TAB circuit. This in turn results in die size reduction (or increased number of nozzles with the same die size), ease of assembly, higher yields, improved reliability, ease of nozzle serviceability, and overall material and manufacturing cost reduction.

While the present invention will be described, for purposes of illustration only, in conjunction with the bonding of conductive leads on a TAB circuit to the silicon substrate of an inkjet printhead, the present method and apparatus for the solderless electrical connection of two contact elements by using a laser light beam attached to a fiber optic system is applicable to bonding any electrical members to each other.

Other advantages will become apparent after reading the disclosure.

BRIEF DESCRIPTION OF THE DRAWINGS

The present invention, and other features and advantages, will be apparent from the following detailed description of the preferred embodiment, taken in conjunction with the accompanying drawings, which illustrate, by way of example, the principles of the invention.

FIG. 5 is a perspective or isometric view of the back surface of the FIG. 4 THA with a silicon substrate mounted thereon and the conductive leads attached to the substrate.

FIG. 6 is a side elevational view in cross-section taken along line A—A in FIG. 5 illustrating the attachment of conductive leads to electrodes on the silicon substrate according to the prior art.

DETAILED DESCRIPTION OF THE PREFERRED EMBODIMENTS

While the present invention will be described, for purposes of illustration only, in conjunction with the bonding of conductive leads on a TAB circuit to conductive pads on the silicon substrate of an inkjet printhead, the present method and apparatus for the preferably solderless electrical connection of two contact elements by using a laser light beam attached to a fiber optic system is applicable to bonding other types of electrical members to each other.

Figure 1:
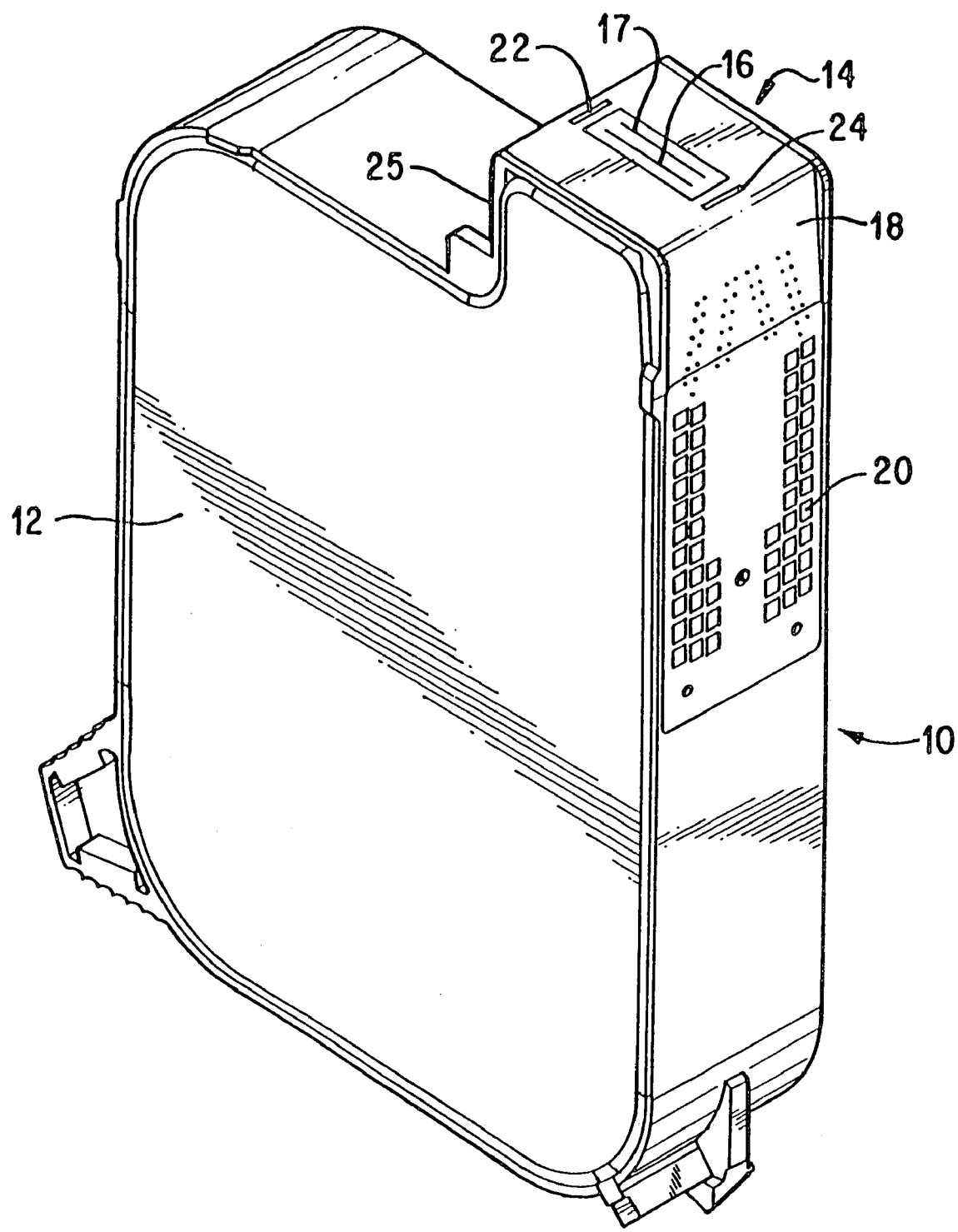
FIG. 1 is a perspective view of an inkjet print cartridge according to one embodiment of the present invention.

Referring to FIG. 1, reference numeral 10 generally indicates an inkjet print cartridge incorporating a printhead according to one embodiment of the present invention simplified for illustrative purposes. The inkjet print cartridge 10 includes an ink reservoir 12 and a printhead 14, where the printhead 14 is formed using Tape Automated Bonding (TAB). The TAB printhead assembly or THA 14 includes a nozzle member 16 comprising two parallel columns of offset holes or orifices 17 formed in a flexible polymer flexible circuit 18 by, for example, laser ablation.

A back surface of the flexible circuit 18 includes conductive traces 36 formed thereon using a conventional photolithographic etching and/or plating process. These conductive traces 36 are terminated by large contact pads 20 designed to interconnect with a printer. The print cartridge 10 is designed to be installed in a printer so that the contact pads 20, on the front surface of the flexible circuit 18, contact printer electrodes providing externally generated energization signals to the printhead. Bonding areas 22 and 24 in the flexible circuit 18 are where the bonding of the conductive traces 36 to electrodes on a silicon substrate containing heater resistors occurs.

In the print cartridge 10 of FIG. 1, the flexible circuit 18 is bent over the back edge of the print cartridge "snout" and extends approximately one half the length of the back wall 25 of the snout. This flap portion of the flexible circuit 18 is needed for the routing of conductive traces 36 which are connected to the substrate electrodes through the far end window 22. The contact pads 20 are located on the flexible circuit 18 which is secured to this wall and the conductive traces 36 are routed over the bend and are connected to the substrate electrodes through the windows 22, 24 in the flexible circuit 18.

Figure 2A:
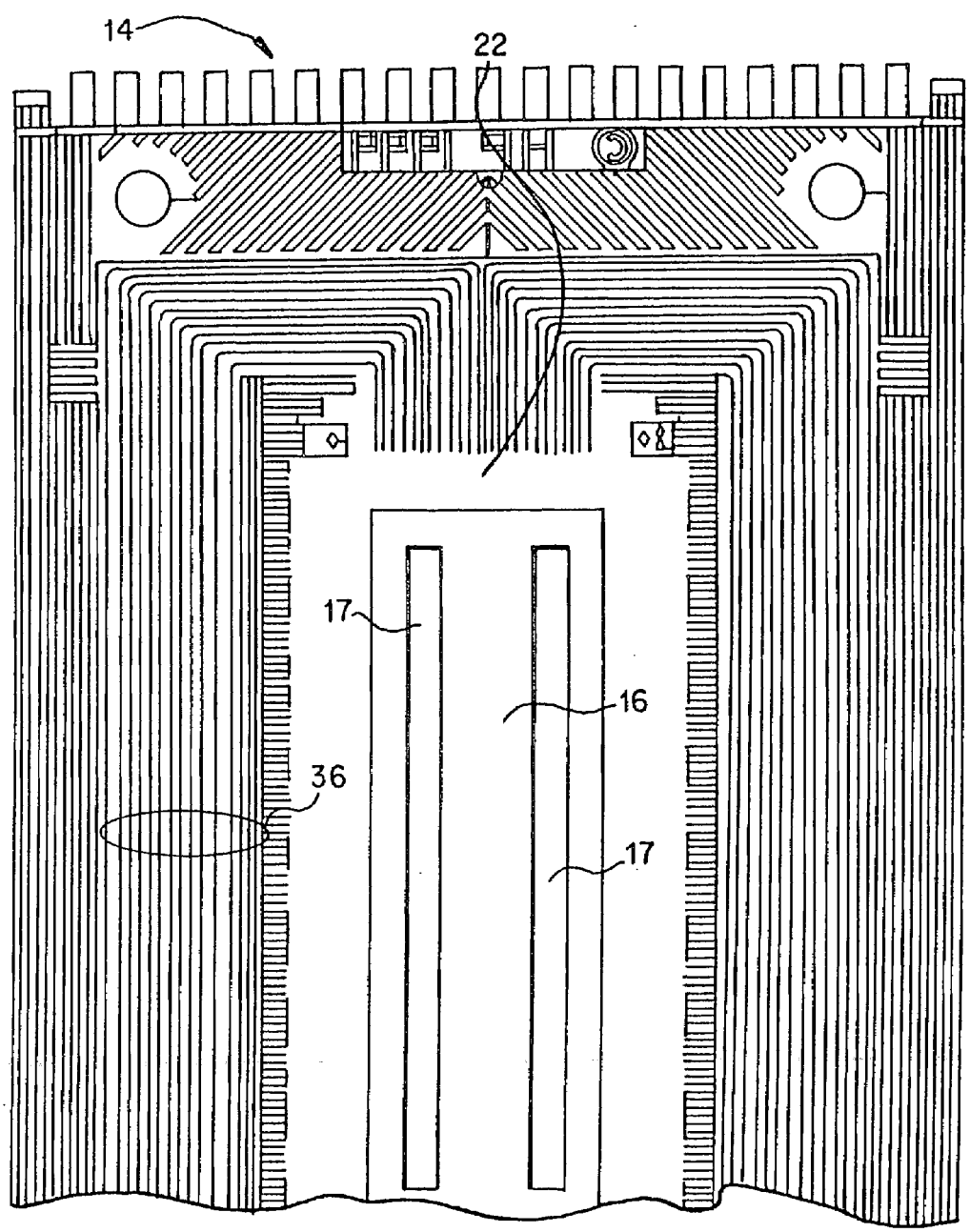
FIG. 2 is a plan or elevational view of the front surface of the Tape Automated Bonding (TAB) printhead assembly (hereinafter "TAB head assembly" or "THA") removed from the print cartridge of FIG. 1.
Figure 2B:
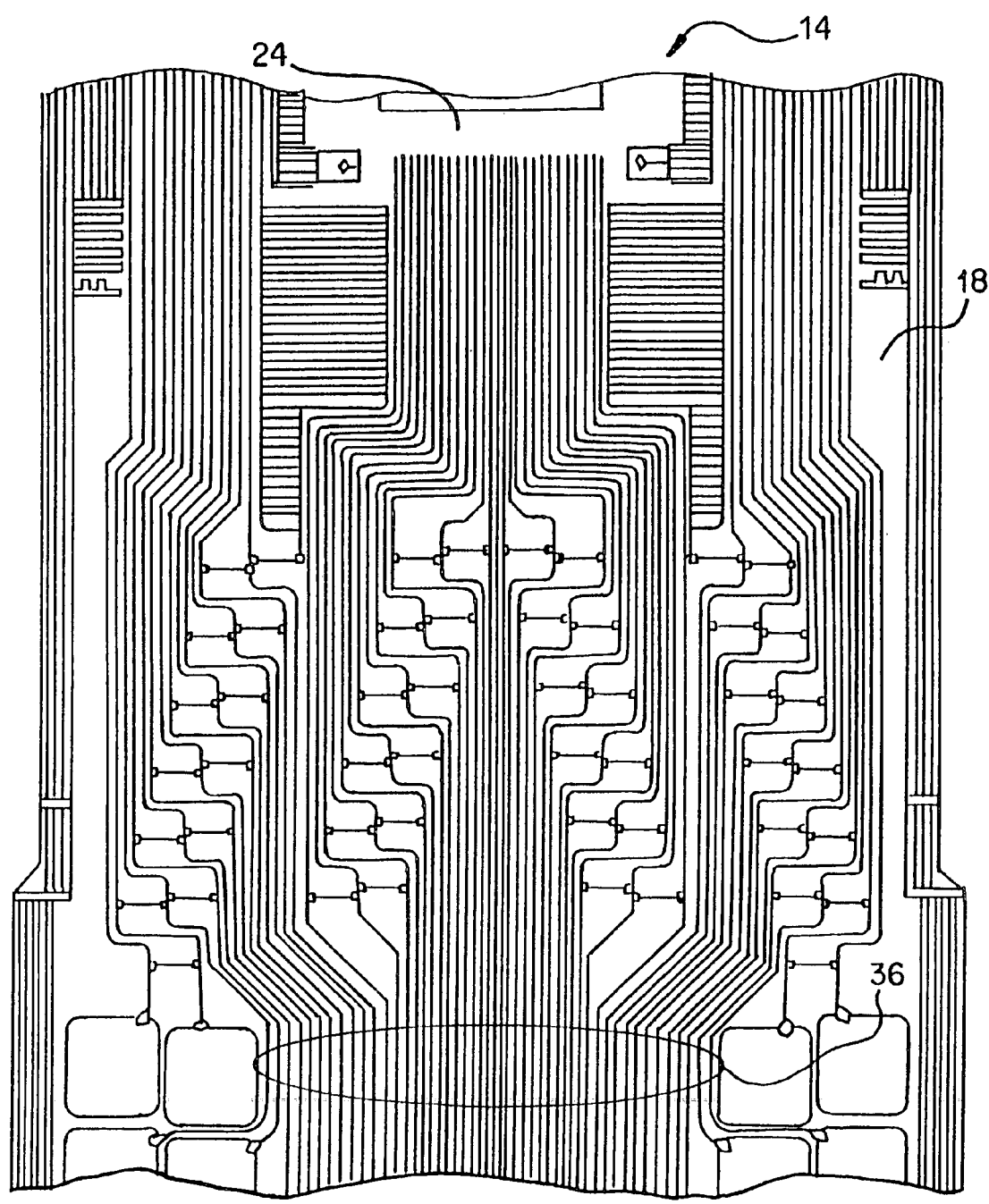
Figure 2C:
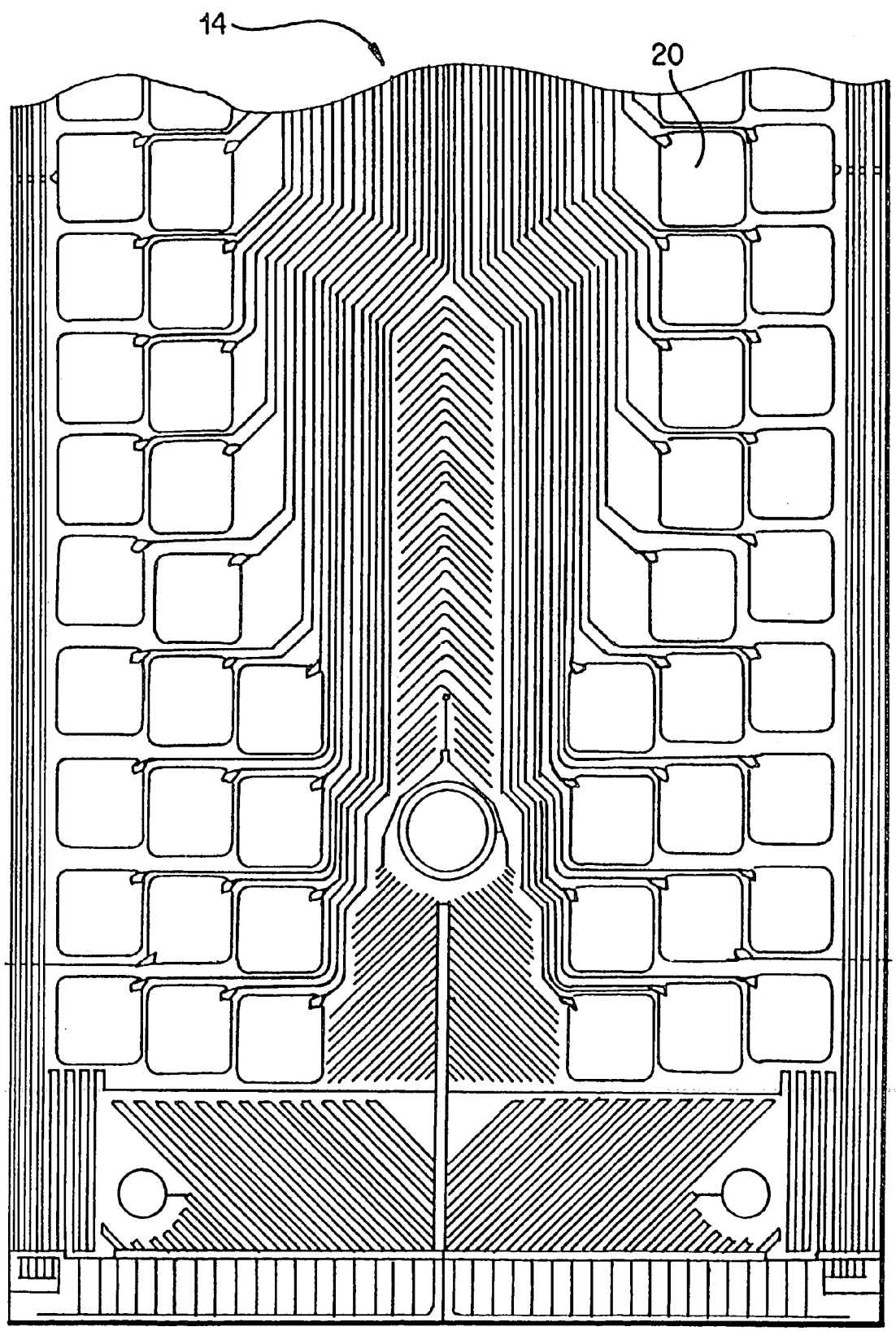

FIG. 2 shows a front view of the THA 14 of FIG. 1 removed from the print cartridge 10 and with solid but transparent windows 22 and 24. TAB head assembly 14 has affixed to the back of the flexible circuit 18 a silicon substrate 28 (not shown) containing a plurality of individually energizable thin film resistors. Each resistor is located generally behind a single orifice 17 and acts as an ohmic heater when selectively energized by one or more pulses applied sequentially or simultaneously to one or more of the contact pads 20.

The orifices 17 and conductive traces 36 may be of any size, and pattern, and the various figures are designed to simply and clearly show the features of the invention. The relative dimensions of the various features have been greatly adjusted for the sake of clarity.

Figure 14:
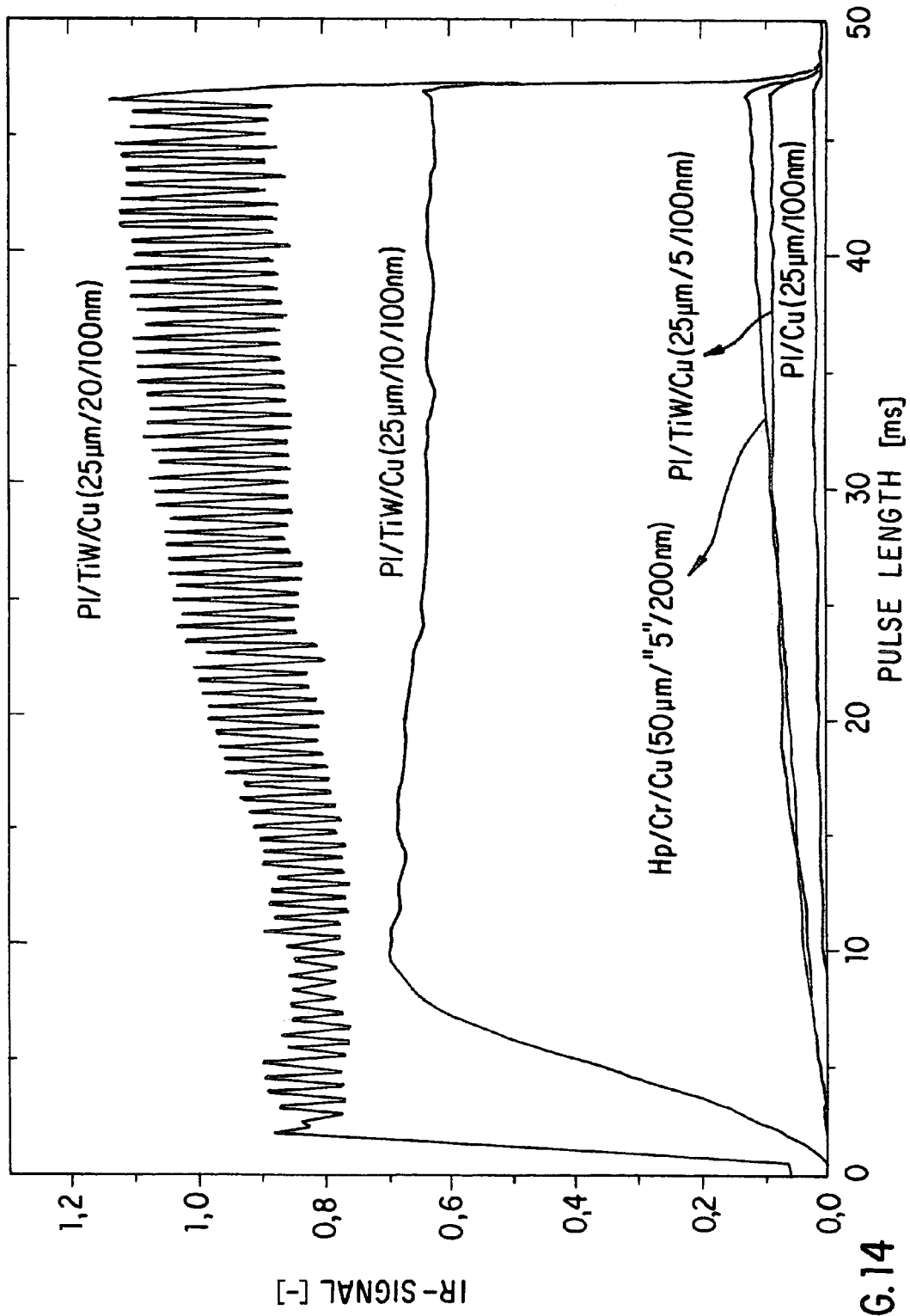
FIG. 14 illustrates the temperature rise in flex circuits with Ti/W seed layers.

The orifice 17 pattern on the flexible circuit 18 shown in FIG. 2 may be formed by a masking process in combination with a laser or other etching means in a step-and-repeat process, which would be readily understood by one of ordinary skill in the art after reading this disclosure. FIG. 14, to be described in detail later, provides additional details of this process. Further details regarding THA 14 and flexible circuit 18 are provided below.

Figure 3:
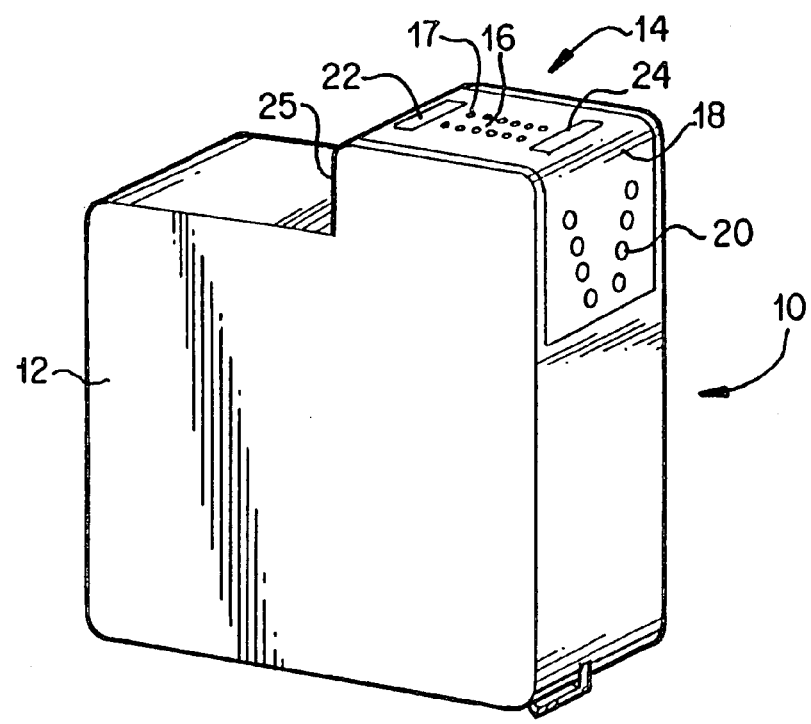
FIG. 3 is a perspective view very simplified and schematic of the inkjet print cartridge of FIG. 1. for illustrative purposes.
Figure 4:
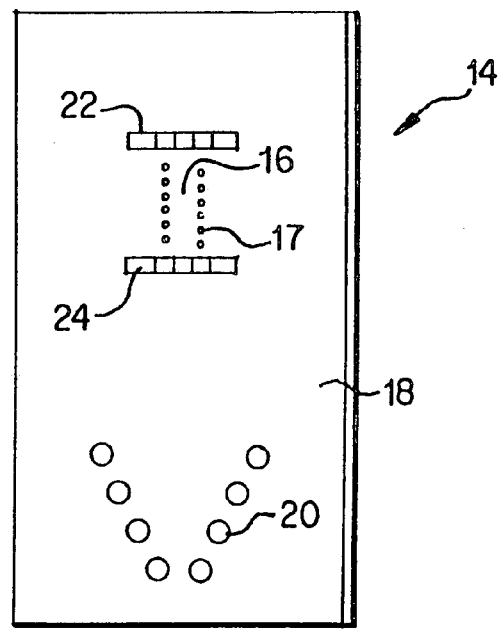
FIG. 4 is a view, like FIG. 2, of the front surface of the THA removed from the print cartridge of FIG. 3.

FIG. 3 is a perspective view, very simplified and schematic of the inkjet print cartridge of FIG. 1 for illustrative purposes. FIG. 4 is a perspective view of the front surface of the THA removed from the print cartridge of FIG. 3.

Figure 7:
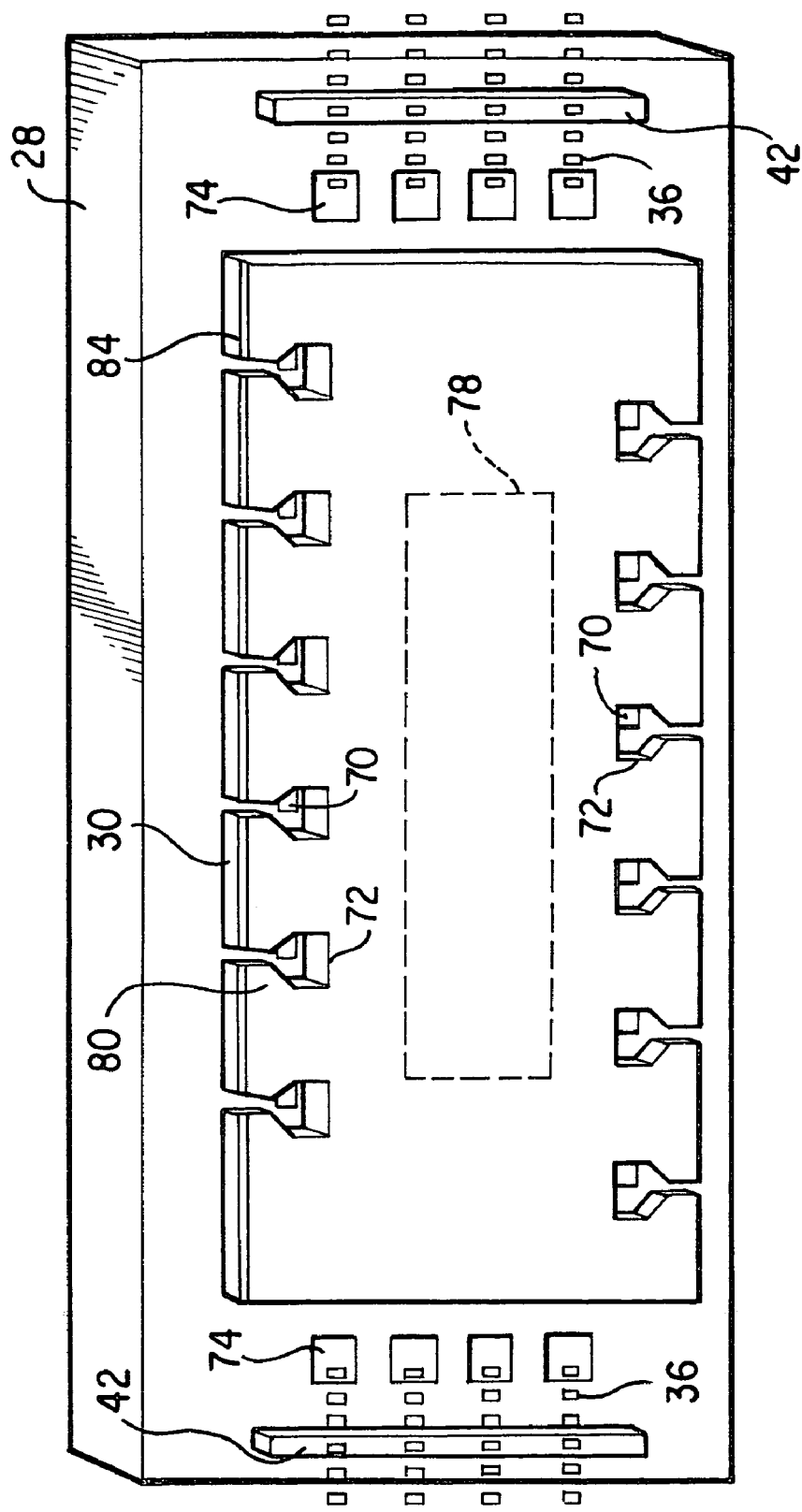
FIG. 7 is a top perspective view of a substrate structure containing heater resistors, ink channels, and vaporization chambers, which is mounted on the back of the FIG. 4 THA.

FIG. 5 shows the back surface of the TAB head assembly 14 of FIG. 4 showing the silicon die or substrate 28 mounted to the back of the flexible circuit 18 and also showing one edge of the barrier layer 30 formed on the substrate 28 containing ink channels and vaporization chambers. FIG. 7 shows greater detail of this barrier layer 30 and will be discussed later. Shown along the edge of the barrier layer 30 are the entrances to the ink channels 32 which receive ink from the ink reservoir 12. The conductive traces 36 formed on the back of the flexible circuit 18 terminate in contact pads 20 (shown in FIG. 4) on the opposite side of the flexible circuit 18 at location 38. The bonding areas 22 and 24 locate where the conductive traces 36 and the substrate electrodes 40 (shown in FIG. 6) are bonded by using a laser light beam attached to a fiber optic system which directs the light to the location to be bonded in accordance with the present invention.

FIG. 6 shows a side view cross-section of a prior-art assembly, such as would be taken along line A—A in FIG. 5 illustrating the connection of the ends of the conductive traces 36 to the electrodes 40 formed on the substrate 28 according to the prior art. As seen in FIG. 6, a portion 42 of the barrier layer 30 is used to insulate the ends of the conductive traces 36 from the substrate 28. Also shown in FIG. 6 is a side view of the flexible circuit 18, the barrier layer 30, the open-window bonding areas 22 and 24, and the entrances of the various ink channels 32. The analogous or corresponding assembly of the present invention departs from that of FIG. 6 particularly in that the bonding regions 22, 24 are not windowed or open but rather are solid, continuous and closed though transparent. Droplets of ink 46 are shown being ejected from orifice holes associated with each of the ink channels 32 as is the case generally with both prior art and the invention.

FIG. 7 is a front perspective view of the silicon substrate 28 which is affixed to the back of the flexible circuit 18 in FIG. 5 to form the THA 14. Silicon substrate 28 has formed on it, using conventional photolithographic techniques, two rows or columns of thin-film resistors 70, shown in FIG. 7 exposed through the vaporization chambers 72 formed in the barrier layer 30.

In one embodiment, the substrate 28 is approximately one-half inch long and contains 300 heater resistors 70, thus enabling a resolution of 600 dots per inch. Heater resistors 70 may instead be any other type of ink ejection element, such as a piezoelectric pump-type element or any other conventional element. Thus, element 70 in all the various figures may be considered to be piezoelectric elements in an alternative embodiment with substantially analogous operation of the printhead. Also formed on the substrate 28 are electrodes 74 for connection to the conductive traces 36 (shown by dashed lines) formed on the back of the flexible circuit 18.

A demultiplexer 78, shown by a dashed outline in FIG. 7, is also formed on the substrate 28 for demultiplexing the incoming multiplexed signals applied to the electrodes 74 and distributing the signals to the various thin film resistors 70. The demultiplexer 78 enables the use of many fewer electrodes 74 than thin film resistors 70. Having fewer electrodes allows all connections to the substrate to be made from the short end portions of the substrate, as shown in FIG. 4, so that these connections will not interfere with the ink flow around the long sides of the substrate. The demultiplexer 78 may be any decoder for decoding encoded signals applied to the electrodes 74. The demultiplexer has input leads (omitted for simplicity) connected to the electrodes 74 and has output leads (not shown) connected to the various resistors 70. The demultiplexer 78 circuitry is discussed in further detail below.

Also formed on the surface of the substrate 28 using conventional photolithographic techniques is the barrier layer 30, which may be a layer of photoresist or some other polymer, in which are formed the vaporization chambers 72 and ink channels 80. A portion 42 of the barrier layer 30 insulates the conductive traces 36 from the underlying substrate 28, as previously discussed with respect to FIG. 4.

In order to adhesively affix the top surface of the barrier layer 30 to the back surface of the flexible circuit 18 shown in FIG. 5, a thin adhesive layer 84 (not shown), such as an uncured layer of poly-isoprene photoresist, is applied to the top surface of the barrier layer 30. A separate adhesive layer may not be necessary if the top of the barrier layer 30 can be otherwise made adhesive. The resulting substrate structure is then positioned with respect to the back surface of the flexible circuit 18 so as to align the resistors 70 with the orifices formed in the flexible circuit 18. This alignment step also inherently aligns the electrodes 74 with the ends of the conductive traces 36. The traces 36 are then bonded to the electrodes 74. This alignment and bonding process is described in more detail later with respect to FIG. 8. The aligned and bonded substrate/flexible circuit structure is then heated while applying pressure to cure the adhesive layer 84 and firmly affix the substrate structure to the back surface of the flexible circuit 18.

Figure 8:
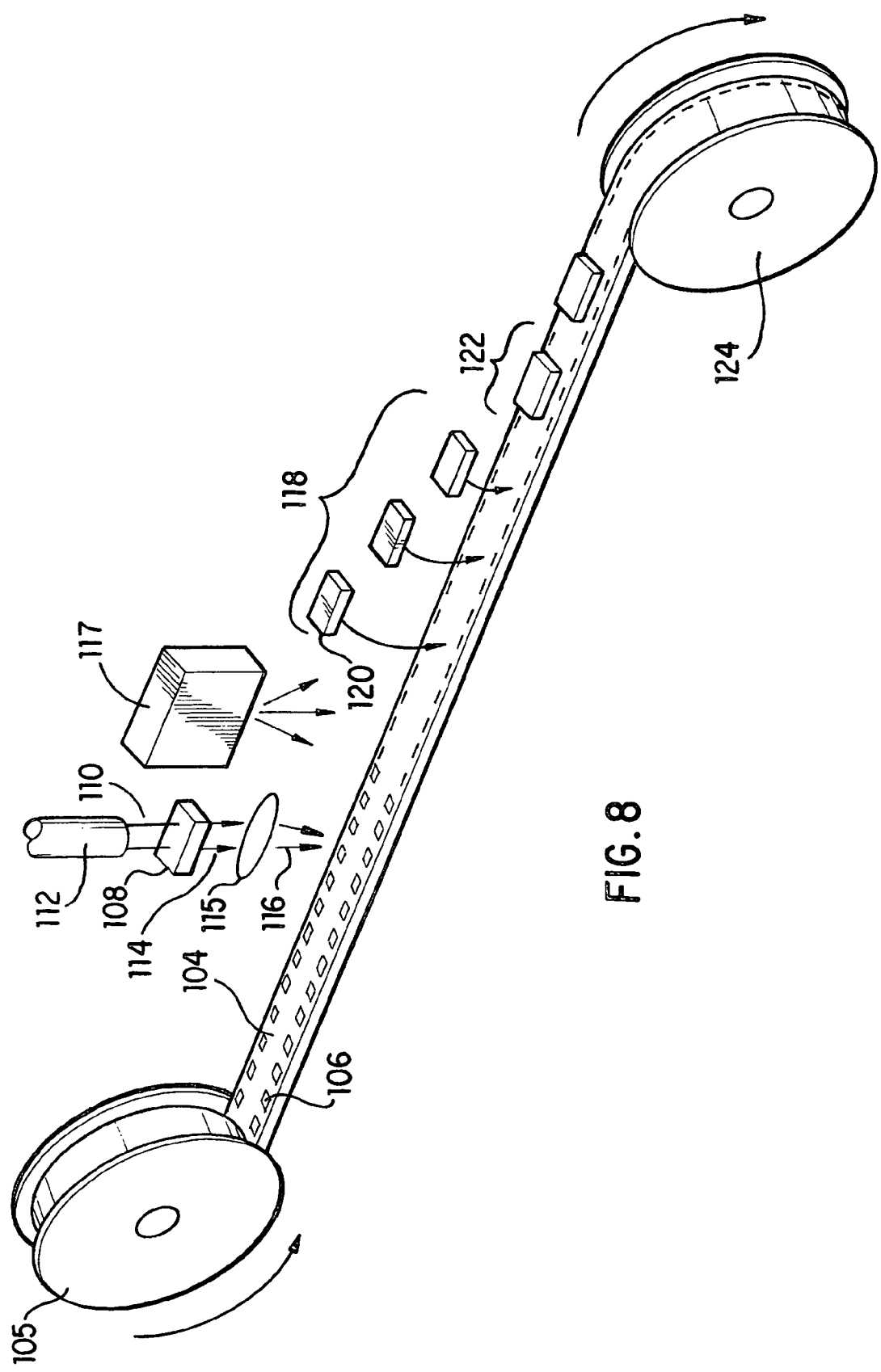
FIG. 8 very schematically illustrates one series of processes which may be used to form the preferred THA.

FIG. 8 illustrates one method for forming the TAB head assembly 14. The starting material is a Kapton or Upilex type polymer tape 104, although the tape 104 can be any suitable polymeric film which is acceptable for use in the below-described procedure. Some such films may comprise teflon, polyamide, polymethylmethacrylate, polycarbonate, polyester, polyamide polyethylene-terephthalate or mixtures thereof.

The tape 104 is typically provided in long strips on a reel 105. Sprocket holes 106 along the sides of the tape 104 are used to accurately and securely transport the tape 104. Alternately, the sprocket holes 106 may be omitted and the tape may be transported with other types of fixtures.

In the preferred embodiment, the tape 104 is already provided with conductive copper traces 36, such as shown in FIGS. 2, 4 and 5, formed thereon using conventional metal deposition and photolithographic processes. The particular pattern of conductive traces depends on the manner in which it is desired to distribute electrical signals to the electrodes formed on silicon dies, which are subsequently mounted on the tape 104.

In the preferred process, the tape 104 is transported to a laser processing chamber and laser-ablated in a pattern defined by one or more masks 108 using laser radiation 110, such as that generated by an Excimer laser 112. The masked laser radiation is designated by arrows 114.

In a preferred embodiment, such masks 108 define all of the ablated features for an extended area of the tape 104, for example encompassing multiple orifices in the case of an orifice pattern mask 108, and multiple vaporization chambers in the case of a vaporization chamber pattern mask 108.

The laser system for this process generally includes beam delivery optics, alignment optics, a high precision and high speed mask shuttle system, and a processing chamber including a mechanism for handling and positioning the tape 104. In the preferred embodiment, the laser system uses a projection mask configuration wherein a precision lens 115 interposed between the mask 108 and the tape 104 projects the excimer laser light onto the tape 104 in the image of the pattern defined on the mask 108. The masked laser radiation exiting from lens 115 is represented by arrows 116. Such a projection mask configuration is advantageous for high precision orifice dimensions, because the mask is physically remote from the nozzle member. After the step of laser-ablation, the polymer tape 104 is stepped, and the process is repeated.

A next step in the process is a cleaning step wherein the laser ablated portion of the tape 104 is positioned under a cleaning station 117. At the cleaning station 117, debris from the laser ablation is removed according to standard industry practice. In actual practice, as is well known to those of ordinary skill in the art, the several stations for ablation, cleaning etc. shown schematically in FIG. 8 as adjacent stations may in fact be in different locales and their functions performed at different times.

In the schematic representation of FIG. 8 the tape 104 is then stepped to the next station, which is an optical alignment station 118 incorporated in a conventional automatic TAB bonder, such as an inner lead bonder commercially available from Shinkawa Corporation, Model No. ILT-75. The bonder is preprogrammed with an alignment (target) pattern on the nozzle member, created in the same manner and/or step as used to created the orifices, and a target pattern on the substrate, created in the same manner and/or step used to create the resistors. In the preferred embodiment, the nozzle member material is semitransparent so that the target pattern on the substrate may be viewed through the nozzle member. The bonder then automatically positions the silicon dies 120 with respect to the nozzle members so as to align the two target patterns. Such an alignment feature exists in the Shinkawa TAB bonder. This automatic alignment of the nozzle member target pattern with the substrate target pattern not only precisely aligns the orifices with the resistors but also inherently aligns the electrodes on the dies 120 with the ends of the conductive traces formed in the tape 104, since the traces and the orifices are aligned in the tape 104, and the substrate electrodes and the heating resistors are aligned on the substrate. Therefore, all patterns on the tape 104 and on the silicon dies 120 will be aligned with respect to one another once the two target patterns are aligned.

Thus, the alignment of the silicon dies 120 with respect to the tape 104 is performed automatically using only commercially available equipment. By integrating the conductive traces with the nozzle member, such an alignment feature is possible. Such integration not only reduces the assembly cost of the printhead but reduces the printhead material cost as well.

The automatic TAB bonder then uses a gang bonding method to bond the conductive traces onto the associated substrate electrodes. Higher bond temperatures are generally preferred to decrease the bond time, but higher bond temperatures will soften the flex circuit and cause more deformation of the Kapton tape. It is extremely preferable to have higher temperature at the contact point and lower temperature at the Kapton tape layer. This optimum contact temperature profile may be achieved by utilizing a known Fiber Push Connect (FPC) single point laser bonding process, and FPC in conjunction with a windowless TAB circuit provides an ideal solution for a THA in an inkjet printer printhead.

For orientation of the reader it may be helpful to point out that in the very highly schematic view of FIG. 8 with the dies shown above the tape, the bonding laser if actually incorporated into the process stream literally as shown in FIG. 8 would be below the tape at position 122, with its beam projected upward toward and through the tape from below. More commonly, again as is well known to those skilled in the art, the die and tape are inverted for bonding (in a different processing station) of their respective bumps and traces, and with the laser projected downward from above.

Figure 9:
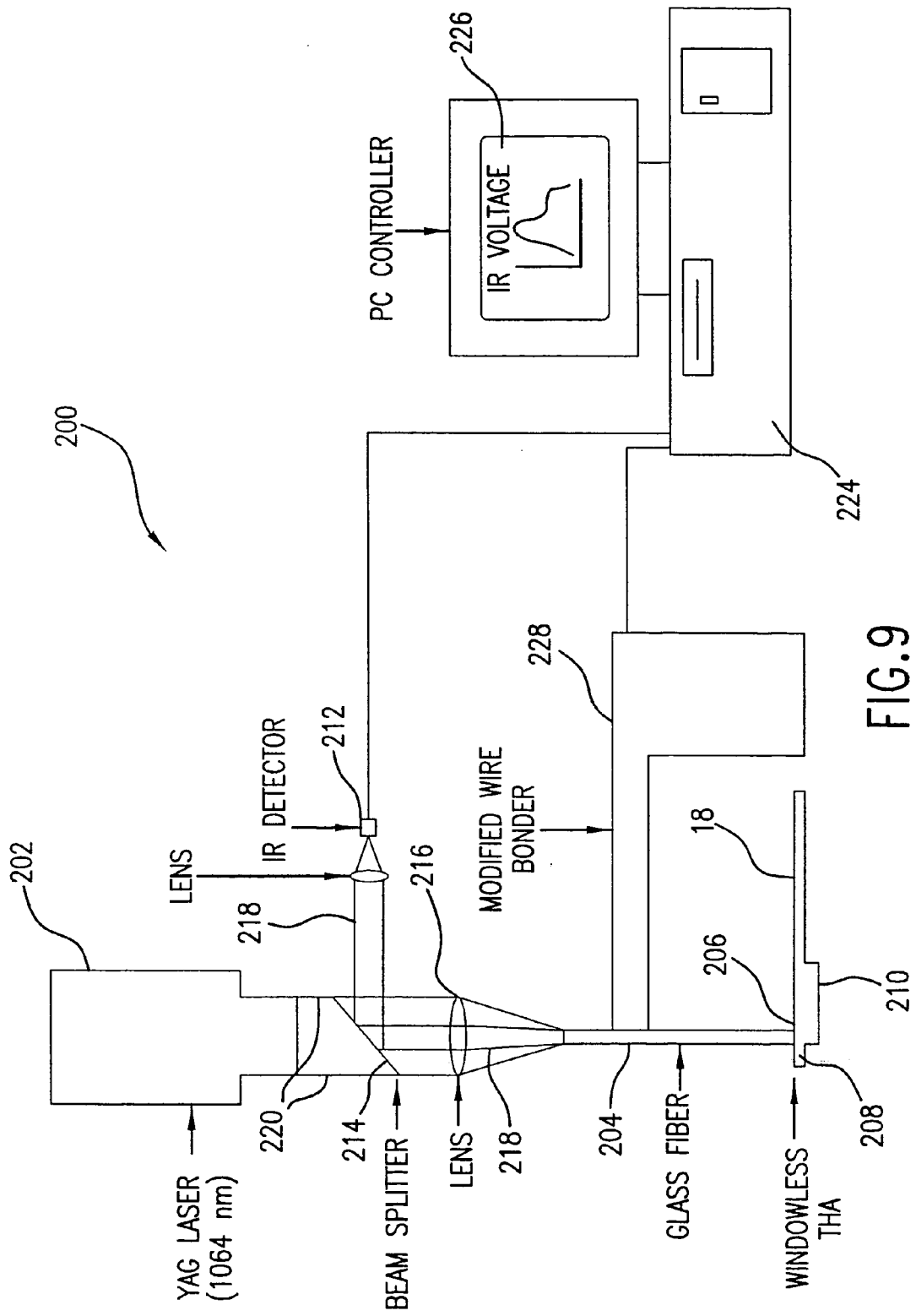
FIG. 9 is a schematic diagram for a fiber push connect laser system as used in the present invention.
Figure 10:
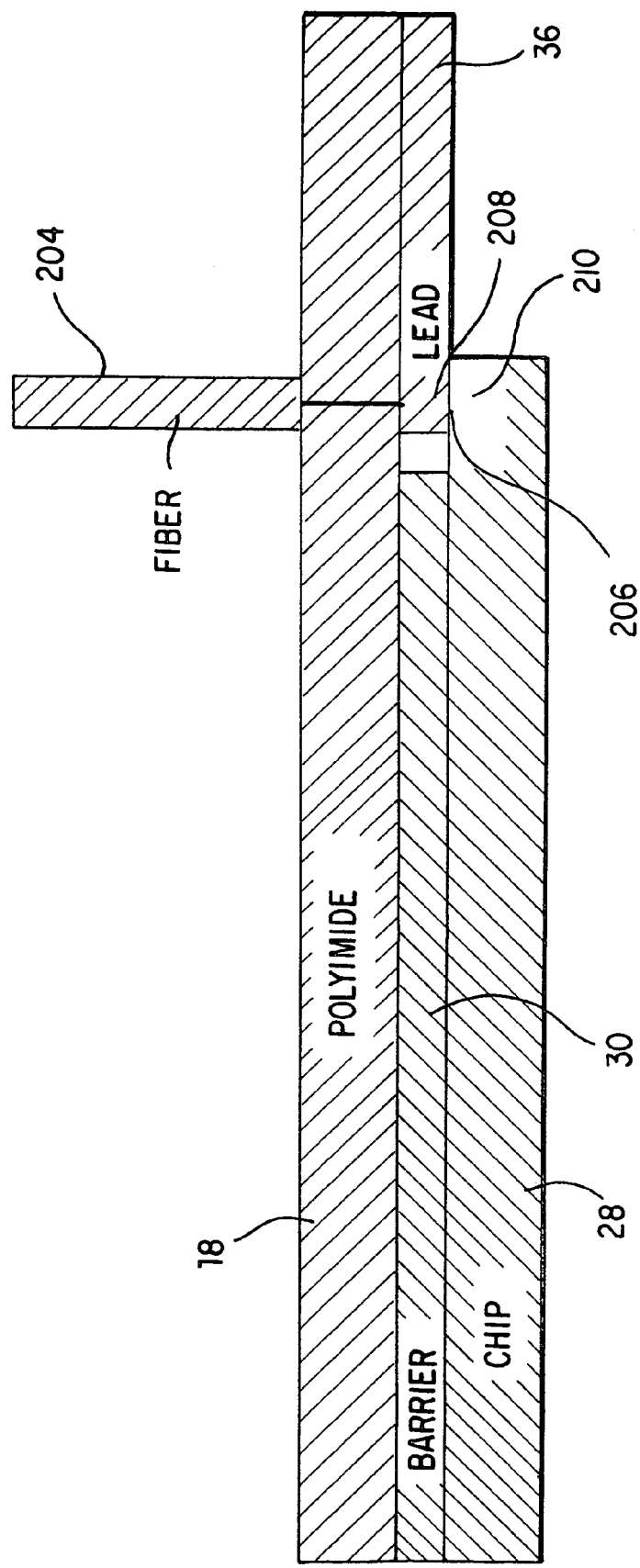
FIG. 10 shows in detail the flex circuit, the contact bond point, the TAB lead and die pad.

A schematic for an FPC laser system 200 is illustrated in FIG. 9. This system consists of an Nd YANG or Diode laser 202, equipped with a glass (SiO2) optical fiber 204. The system guides the laser beam to the contact or attach point 206 via the optical glass fiber 204. An optimum thermal coupling is achieved by pressing two parts together by means of the fiber 204 which creates a zero contact gap between the TAB lead 208 and die pad 210 and thus improved thermal efficiency. FIG. 10 shows in greater detail the flex circuit 18, the contact point 206, the TAB lead 208 and die pad 210.

Referring to FIG. 9, a feedback temperature loop is achieved by means of an infrared detector 212 through the glass fiber. The temperature or absorption behavior response of the IR-radiation reflected by the contact elements 208, 210 at the contact point 206 is sensed. The outgoing laser beam 220 from the laser source 202 goes through a half-transmission mirror or beam splitter 214 and through a focussing lens 216 into the glass fiber optic 204. The reflected light 218 from the fiber optic is reflected by the half mirror 21 and arrives via focussing lens 222 at an IR detector 212 that is connected to a PC Controller 224. The graph shown on the monitor 226 of PC controller 224 is meant to show that the PC Controller 224 can store definite expected plots for the temperature variation of the bonding process with which the actual temperature variation can be compared. The PC Controller 224 is connected with the laser source 202 so that the laser parameters can be controlled if necessary.

The reproducibility of an FPC laser bond depends both on a high degree of thermal coupling between the two elements 208, 210 and high absorption of the laser energy by conductive leads 74, 36. To optimize the bonding process, minimum absorption is desired in the Kapton tape and maximum absorption is desired in the flex circuit 18 metal layer. Metals with higher absorption rate will transform a higher share of the laser energy into heat. This will result in a shorter attachment process which in turn will result in a higher quality bond.

Figure 12:
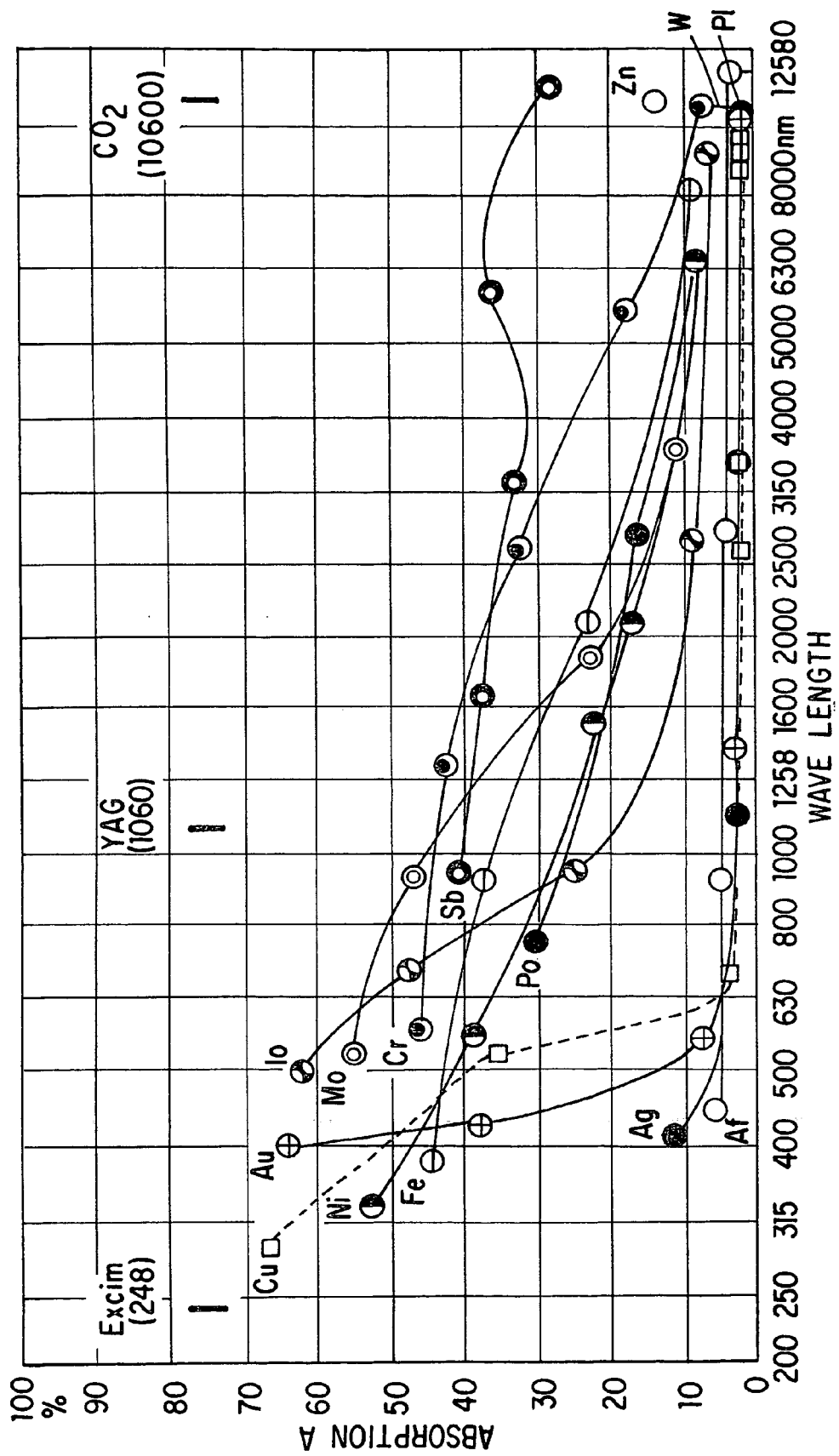
FIG. 12 shows the absorption property versus wavelength for various metals.

The laser utilized is a YAG laser with a wavelength of 1064 nm. FIG. 12 illustrates the absorption property versus wavelength for several metals. As can be observed from FIG. 12, chromium and molybdenum have the highest absorption characteristics at this wavelength. Chromium was selected as the base metal due to the fact that most flex circuit manufacturers are using chromium as a so-called "seed layer", explained below. The penetration depth of the laser into chromium is about 10 nm with a spot size of 5 nm, thus requiring a minimum chromium thickness of 15 nm. The laser beam creates a localized heated zone causing the metals (or solder material if used), to melt and create a bond between two joining surfaces without increasing the temperature of the Kapton tape. However, any gap between two mating metal parts will cause overheating of the metal surface exposed to the laser beam. This will cause deformation of the TAB leads with no bond between metal surfaces. Also, an increased temperature in the flex will cause damage to the flex circuit.

Figure 11:
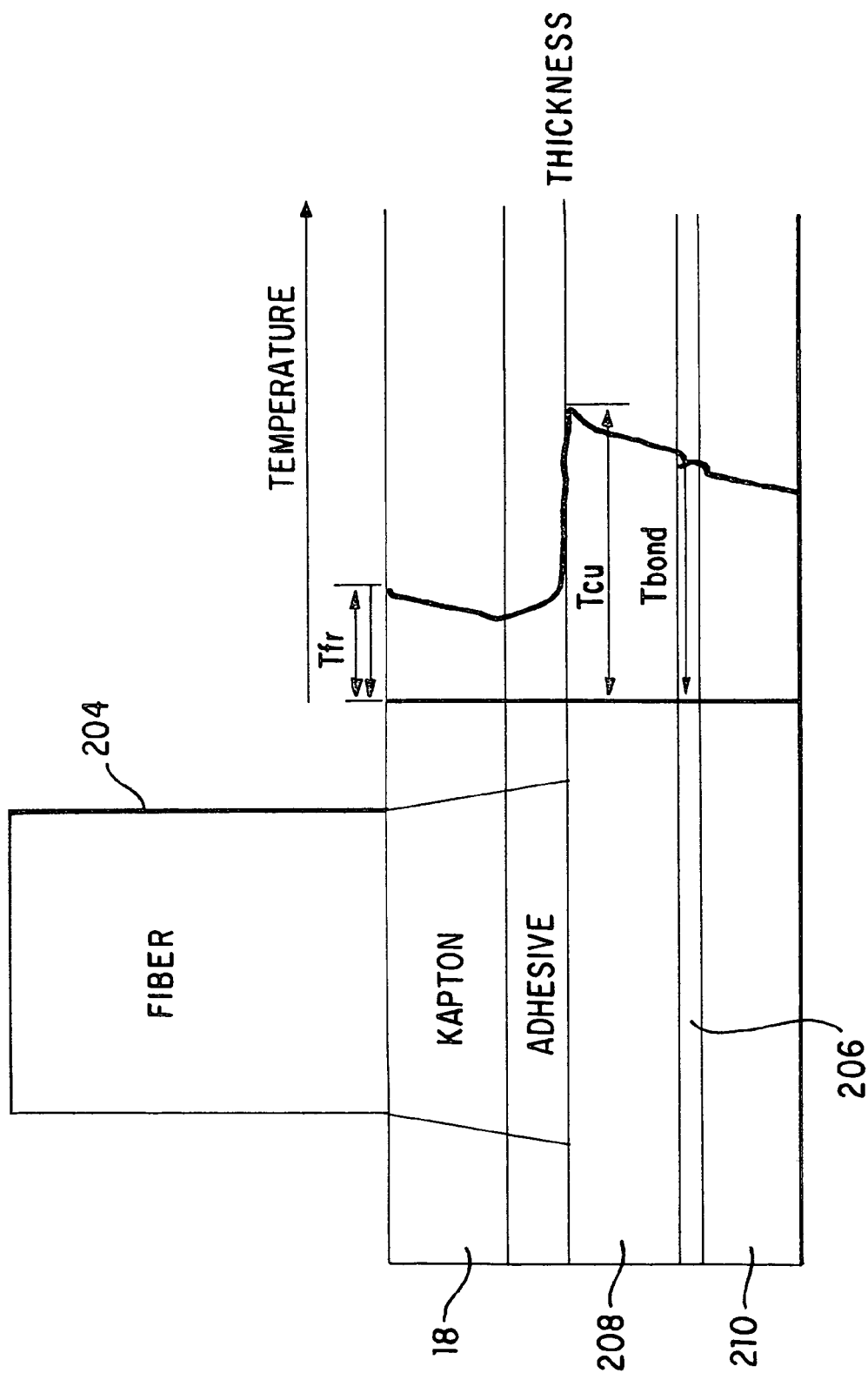
FIG. 11 shows the temperature profile of the flex circuit, TAB lead, bond location and die pad during the bonding process with the FPC laser.

FIG. 11 illustrates a typical temperature profile of the flex circuit 18 during bonding process with the FPC laser. As can be observed from FIG. 11, the temperature at the attachment area 206 is considerably higher than the Kapton tape 18 temperature. This is achieved due to the high degree of the transparency of the Kapton tape at different wavelengths.

The Kapton polyimide tape is transparent to the YAG laser beam, and the laser beam passes through the 2 mil thick layer of polyimide with minimal absorption. Chromium is a conventional seed layer that is used extensively to provide an adhesion layer between the copper trace and Kapton polyimide in a two-layer flex circuit manufacturing process. A chromium layer with a minimum thickness of 10 nm (or 20 nm nominal) is required to provide a medium which absorbs the laser energy. The thickness of the chromium layer varies depending upon the flex circuit manufacturer, with reported thicknesses between 2 and 30 nm. A typical flex circuit manufacturing process utilizes a thin layer (20 nm) of sputtered chromium as a seed (adhesion) layer between the copper traces and Kapton polyimide.

Figure 13:
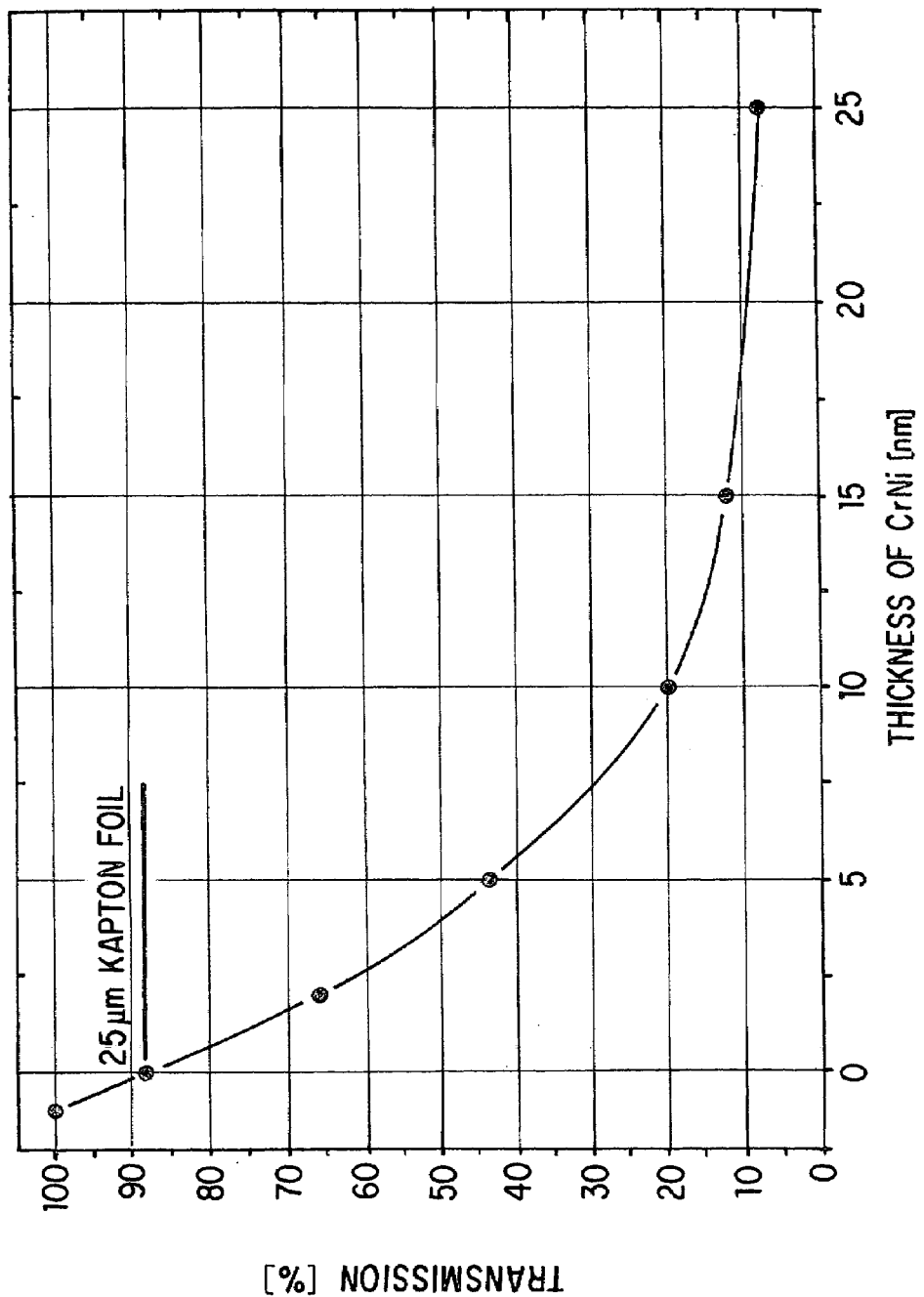
FIG. 13 ilustrates the optical transmission results for five samples of the Kapton tape sputtered with 2, 5, 10, 15, and 25 nm of chromium.

Five samples of the Kapton tape were sputtered with 2, 5, 10, 15, and 25 nm of chromium, and optical transmission was measured for these samples. FIG. 13 illustrates the optical transmission results for these samples. It can be seen that optical transmission initially drops rapidly with increased chromium thickness (from 65% for 2 nm of chromium, to 12% for 15 nm of chromium), but optical transmission changes very slowly when chromium thickness increases from 15 to 25 nm.

Figure 15:
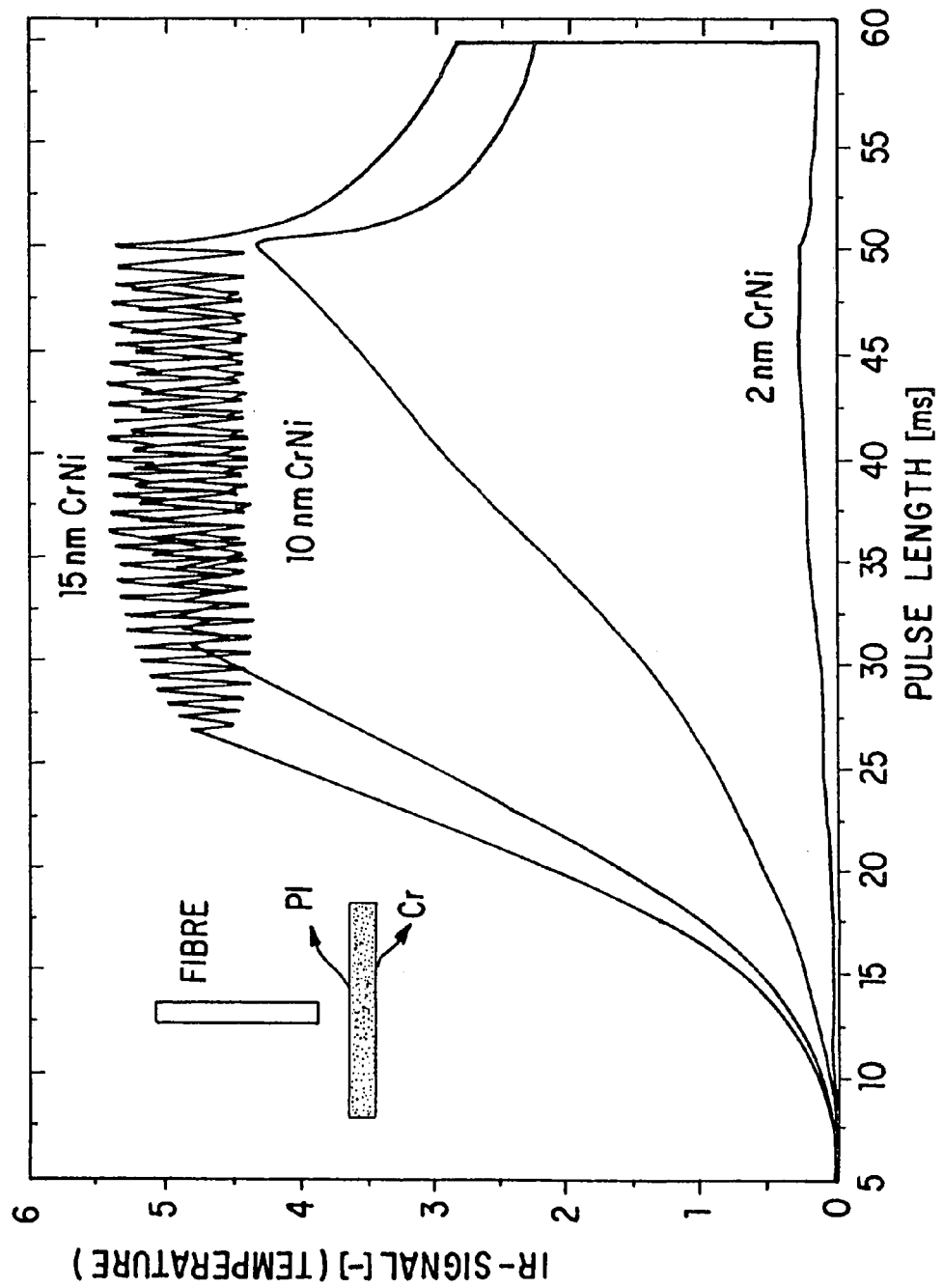
FIG. 15 illustrates the temperature rise in flex circuits with a chromium seed layer.

Laser bonding process requires a fast temperature rise in the conductive trace to minimize the temperature rise in the Kapton and therefore minimize damage to the Kapton tape. FIGS. 14 and 15 illustrate temperature rise in several flex circuits with different constructions. FIG. 14 illustrates temperature rise in flex circuits with thicker seed layers. It is important to notice that flex circuits with 10 nm or less of Ti/W did not reach the temperature that is required for gold/gold bonding, but the flex circuit with 20 nm of Ti/W did reach the bonding temperature. Also, it should be noted that the rise time in the flex circuit with thicker Ti/W is faster, minimizing the potential of damage due to high localized temperatures in the Kapton tape.

The temperature (IR-Signal) fluctuation in the flex circuit with 20 nm of Ti/W is indicative of the fact that this flex circuit reached the maximum preset temperature required for gold/gold bonding and then the laser feed-back loop temporarily dropped the laser energy so that increase in the TAB bond temperature did not damage the Kapton tape. As soon as the temperature of the Kapton tape dropped (by a preset amount), the laser energy automatically increased to fill power to increase the TAB lead temperature, and created a reliable gold/gold bond.

FIG. 15 illustrates similar results for different flex circuits with a chromium seed layer as opposed to Ti/W seed layer. It can be observed that flex circuit with 10 nm of chromium did reach the preset temperature required for gold/gold bonding. Therefore, chromium seed layer has higher absorption characteristics compared to Ti/W seed layer for a YAG laser.

Figure 16:
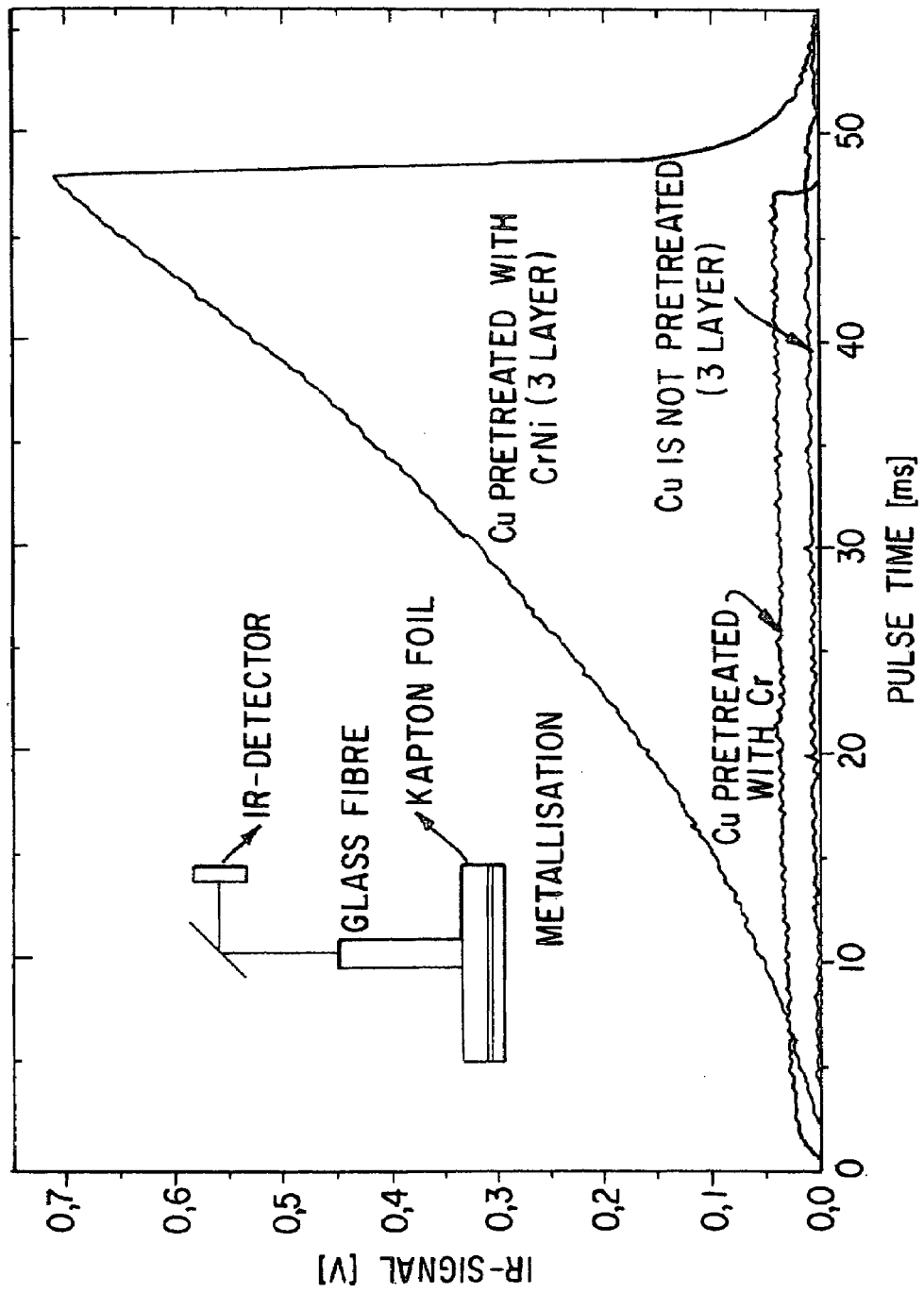
FIG. 16 illustrates temperature increase versus time in a 3-layer tape with different thickness chromium seed layers.

FIG. 16 illustrates temperature increase versus time in a 3-layer tape with a 20 nm chromium layer, a tape with a 5 nm chromium layer, and a tape with no chromium layer. As can be seen in FIG. 16, only the flex circuit with a 20 nm chromium layer indicated a rapid temperature rise.

Since it was established that chromium thickness is essential to the integrity of the gold/gold laser bond, when a YAG laser is used, an optimum chromium thickness was selected as a base line. Referring to FIG. 13, a chromium thickness over 15 nm does not decrease transmission drastically. Based on FIG. 15, a chromium thickness of 10 nanometers is the absolute minimum required thickness to provide a successful laser bond. FIG. 15 also illustrates that a flex circuit with 15 nm of chromium exhibits a much faster temperature rise in the copper trace, resulting in less or no damage to the Kapton tape. Therefore, 15 nm of chromium is optimum to provide a reliable and repeatable laser bond.

Some chromium diffusion into the copper is expected during the subsequent sputtering of chromium as a seed layer and plating processes during manufacture of the flex circuits. Diffusion of the chromium into the copper is a time and temperature dependent process, and it is difficult to determine the amount of chromium that will be diffused into the copper during these processes. Normally, it is estimated that maximum amount of diffused chromium is under 5 nm. Based on these factors, a minimum chromium thickness after the sputtering process was established as 20 nm. This thickness should gurantee a minimum chromium thickness of 15 nm after the completed manufacture of the flex circuit.

Figure 17:
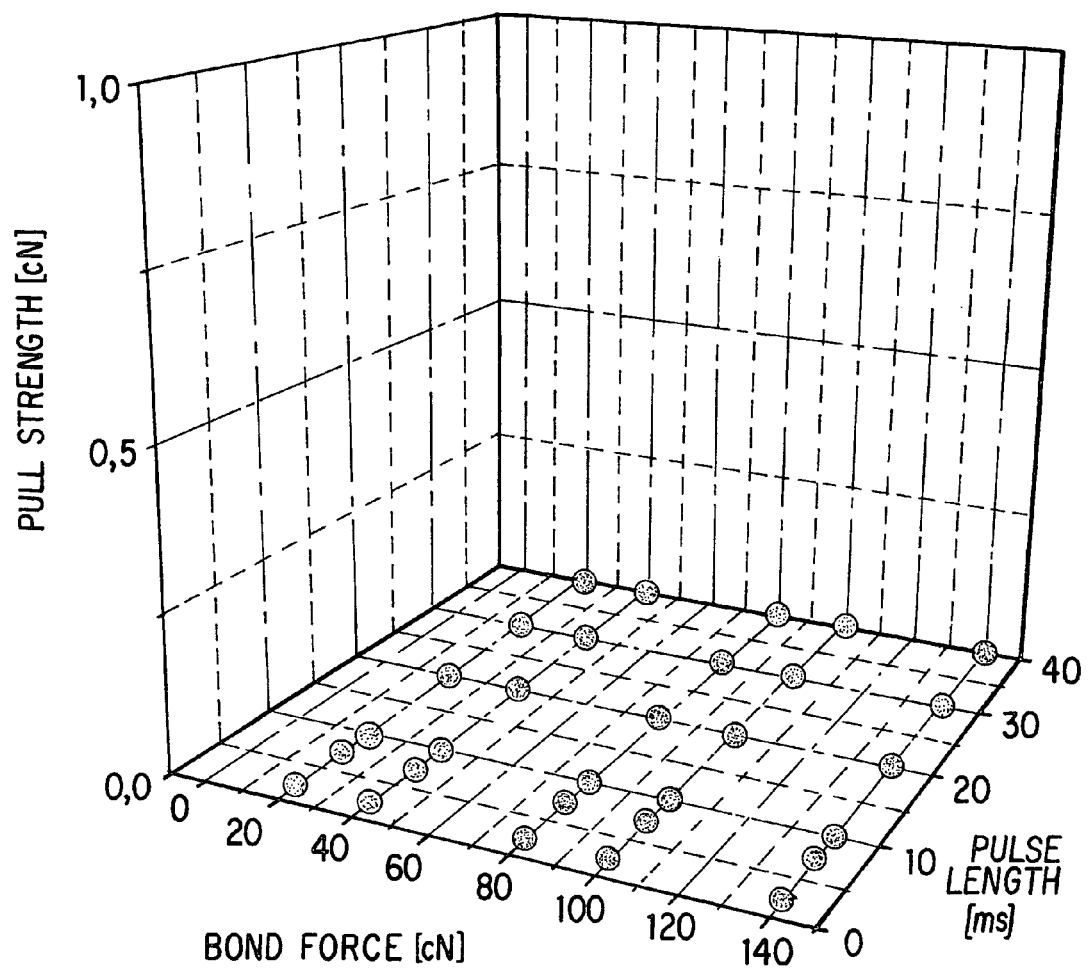
FIG. 17 shows the results of a laser bonding experiment to evaluate the laser bondability of a flex circuit.

FIG. 17 shows the results of a laser bonding experiment to evaluate the laser bondability of a flex circuit having about 5 nm of chromium as a seed layer. In this experiment the bond force was varied from 20 to 140 grams (20, 40, 60, 80, 100 and 140 grams), and the laser pulse length was varied from 2 to 40 milliseconds (2, 7, 10, 20, 30 and 40 milliseconds). The fixed factors in this experiment are die nest temperature, laser current, maximum feed back temperature and temperature rise time. By varying the laser energy no bond was formed between the TAB lead 208 and the die pad 210. This is due to low laser energy absorption of the flex circuit due to insufficient thickness of chromium seed layer.

Table I indicates the test conditions and test results for several experiments. These tests covered a large cross-section of operating conditions, ranging from no visible effect on the bond to full Kapton damage. Based on the results illustrated in Table I, it was concluded that the existing YAG laser is not capable of bonding existing flex circuits with low chromium thickness.

A 3-layer flex circuit with 20 nm of chromium with an adhesive layer between the Kapton, and copper trace was tested. A successful gold/gold laser bonding was achieved with a laser power set at 10 W, pulse length set at 20 ms, bond force set at 140 grams, and die nest temperature set at 100 degrees C. No mechanical damage was observed in the die pad area. This is an indication that neither the laser energy or the force caused any mechanical damage to the die pad area.

Table II indicates the test conditions and test results for seven experiments. For grading the laser bond results; an "A" quality bond is defined as a bond that has a cross section similar to the thermal compression bonded die, with the same or better peel strength. A "B" quality bond is a bond that still has an acceptable bond strength, but the Kapton joint has been degraded due to higher temperatures (a "B" quality bond may still be acceptable). In a "C" quality bond, the bond strength is lower than that of thermal-compression-bonded parts. An "F" quality bond is defined as absence of bond formation between the copper trace and the die pad (in most cases Kapton burned due to increased localized temperature).

grams to 100 grams. In this case, very much similar to Test No. five, excellent bonds were observed, with high joint strength. However, a possible tape damage was observed in one die site. In this case also, there was no exposed copper trace or TAB lead.

TABLE I

| Item | Force Grams | Laser Current Amp | Pulse Length milli-sec | Max Temp. Setting | Observation |
|------|-------------|-------------------|------------------------|-------------------|-------------|
| 1 | 140 | 17 | 5 | 0.4 | No bond/No damage to flex |
| 2 | 140 | 17 | 30 | 0.4 | No bond/No damage to flex |
| 3 | 140 | 19 | 5 | 0.4 | No bond/No damage to flex |
| 4 | 140 | 19 | 30 | 0.4 | No bond/No damage to flex |
| 5 | 100 | 17 | 5 | 0.4 | No bond/No damage to flex |
| 6 | 100 | 17 | 30 | 0.4 | No bond/No damage to flex |
| 7 | 100 | 19 | 5 | 0.4 | No bond/No damage to flex |
| 8 | 100 | 19 | 30 | 0.4 | No bond/No damage to flex |
| 9 | 140 | 19 | 30 | 0.6 | No bond/Flex started to burn |
| 10 | 140 | 19 | 30 | 0.8 | No bond/Some flex damage observed |
| 11 | 140 | 19 | 30 | 1 | No bond/Flex damage clearly observed |
| 12 | 140 | 19 | 50 | 1 | No bond/Some flex damage observed |
| 13 | 140 | 19 | 50 | 2 | No bond/Flex damage clearly observed |
| 14 | 140 | 19 | 30 | 5 | No bond/Flex damage clearly observed |
| 15 | 140 | 19 | 30 | 9 | No bond/Excessive flex damage |
| 16 | 140 | 19 | 50 | 9 | No bond/Excessive flex damage |

TABLE II

| Test | Force Grams | Laser Amp | Pulse milli-sec | Max Temp. Setting | Bond Quality | Observation |
|------|-------------|-----------|-----------------|-------------------|--------------|-------------|
| 1 | 140 | 17 | 5 | 0.6 | C | Weak bond formed at most bond sites |
| 2 | 140 | 17 | 10 | 0.6 | B | Acceptable bond formed, but burned kapton in one site |
| 3 | 140 | 17.5 | 5 | 0.8 | C | Weak bond formed at most bond sites |
| 4 | 140 | 19 | 5 | 0.8 | A | Good bond formed, no damage to kapton |
| 5 | 140 | 19 | 10 | 0.8 | B | Excellent bond formed, but kapton burned in some sites |
| 6 | 140 | 19 | 15 | 0.8 | F | Burned kapton, no bonds were formed |
| 7 | 100 | 19 | 10 | 0.8 | B | Excellent bond formed, but kapton burned in one site |

By increasing the pulse length from 5 to 10 milliseconds in Test No. 2, bond quality improved drastically, but in this case Kapton did burn in one die site. By reducing the pulse length again to 5 milliseconds, and increasing the laser power (by means of increasing the laser current), the bonds became weak again, but burned Kapton was not observed any more. To further improve the bonding, the laser power was increased a second time by increasing the current. In Test No. 4, good, clean bonds were formed and no damage to the Kapton was observed. A peel test of parts built with these set of parameters indicated a good peel strength also. Joint strength was further improved by increasing the laser power. In Test No. 5 the power was increased by increasing the pulse length from 5 to 10 milliseconds. In this case the joint strength improved drastically, but some burned Kapton was also observed. In the case of Tests No. 2 and 5 the burned Kapton was on the copper lead side, and there were no openings exposing the copper lead. Therefore, it is suspected that the adhesive layer between the Kapton and copper lead has burned. In Test No. 6, the laser current was maintained at 19 amps, but pulse length was increased from 10 to 15 milliseconds. This resulted in a laser over energy which burned several holes all the way through the Kapton, without causing any connection between the TAB lead and the die pad.

Test No. 7 is a repeat of the Test No. 5, with a smaller probe force. In Test No. 7 probe force was reduced from 140

Based on the results stated in Table II, a bondability window for 3-layer tape may be defined as follows:

| | |
|---|---|
| Bond Force: | 100–140 grams |
| Laser Current: | 17–20 Amps |
| Pulse Length: | 5–10 milliseconds |
| Maximum Set Temperature: | 0.6–0.8 |

Experiments were also performed utilizing a 2-layer tape with 20 nanometers of sputtered chromium. An experimental design was set-up to evaluate effects of force, pulse length, and laser power on the quality of the bond. This experiment was set-up with the variables force, pulse length, and laser power tested at three levels, resulting in 27 individual tests and 27 bonded parts utilizing the FPC laser. All 27 parts passed visual inspection, indicating no damage to Kapton or barrier. The Kapton was then etched to expose the TAB lead. A shear test and a pull test were performed on the 27 parts to evaluate the bond strength. The shear and pull tests indicated a bond strength of well over 200 grams for higher laser powers. Table III indicates the test conditions and the bond strength results for the 27 experiments.

TABLE III

| Test Number | Bond Force Grams | Bond Time Milliseconds | Laser Power Watts | Shear Strength Grams | Push Strength Grams |
|---|---|---|---|---|---|
| 1 | 310 | 20 | 5.0 | 0 | 0 |
| 2 | 310 | 20 | 6.2 | 82 | 106 |
| 3 | 310 | 20 | 8.5 | 176 | 177 |
| 4 | 310 | 40 | 5.0 | 0 | 0 |
| 5 | 310 | 40 | 6.2 | 90 | 137 |
| 6 | 310 | 40 | 8.5 | 182 | 169 |
| 7 | 310 | 60 | 5.0 | 0 | 0 |
| 8 | 310 | 60 | 6.2 | 131 | 132 |
| 9 | 310 | 60 | 8.5 | 186 | 191 |
| 10 | 360 | 20 | 5.0 | 0 | 0 |
| 11 | 360 | 20 | 6.2 | 139 | 112 |
| 12 | 360 | 20 | 8.5 | 189 | 165 |
| 13 | 360 | 40 | 5.0 | 0 | 0 |
| 14 | 360 | 40 | 6.2 | 146 | 154 |
| 15 | 360 | 40 | 8.5 | 205 | 201 |
| 16 | 360 | 60 | 5.0 | 0 | 0 |
| 17 | 360 | 60 | 6.2 | 105 | 177 |
| 18 | 360 | 60 | 8.5 | 225 | 224 |
| 19 | 412 | 20 | 5.0 | 0 | 0 |
| 20 | 412 | 20 | 6.2 | 88 | 165 |
| 21 | 412 | 20 | 8.5 | 211 | 207 |
| 22 | 412 | 40 | 5.0 | 0 | 0 |
| 23 | 412 | 40 | 6.2 | 178 | 198 |
| 24 | 412 | 40 | 8.5 | 222 | 195 |
| 25 | 412 | 60 | 5.0 | 0 | 0 |
| 26 | 412 | 60 | 6.2 | 148 | 177 |
| 27 | 412 | 60 | 8.5 | 210 | 193 |

The experiments established that gold to gold windowless TAB bonding is feasible. Shear strengths of well over 200 grams can be achieved easily and repeatedly. No Kapton or barrier damage was observed due to the laser bonding process. Based on the results stated in Table III, a bondability window for 2-layer tape may be defined as follows:

|  | Low | Medium | High |
|---|---|---|---|
| Fiber-push Force | 310 grams | 360 grams | 420 grams |
| Pulse Time | 20 msec | 40 msec | 60 msec |
| Laser Power | 5 watts | 6.2 watts | 8.5 watts |

The present invention eliminates the need for the TAB window and the associated encapsulation of the prior art and results in a planar TAB connect process. This in turn results in lower cost, higher reliability and ease of serviceability.

After bonder 18 (FIG. 8) the tape 104 is then stepped or removed to a heat and pressure station 122. As previously discussed with respect to FIGS. 9 and 10, an adhesive layer 84 exists on the top surface of the barrier layer 30 formed on the silicon substrate. After the above-described bonding step, the silicon dies 120 are then pressed down against the tape 104, and heat is applied to cure the adhesive layer 84 and physically bond the dies 120 to the tape 104.

Thereafter the tape 104 steps and is optionally taken up on the take-up reel 124. The tape 104 may then later be cut to separate the individual TAB head assemblies from one another.

The resulting TAB head assembly is then positioned on the print cartridge 10, and the previously described adhesive seal 90 is formed to firmly secure the nozzle member to the print cartridge, provide an ink-proof seal around the substrate between the nozzle member and the ink reservoir, and encapsulate the traces in the vicinity of the headland so as to isolate the traces from the ink.

Peripheral points on the flexible TAB head assembly are then secured to the plastic print cartridge 10 by a conventional melt-through type bonding process to cause the polymer flexible circuit 18 to remain relatively flush with the surface of the print cartridge 10, as shown in FIG. 1.

The foregoing has described the principles, preferred embodiments and modes of operation of the present invention. However, the invention should not be construed as being limited to the particular embodiments discussed. As an example, while the present invention was described in conjunction with the bonding of conductive traces on a TAB circuit to the silicon substrate of an inkjet printhead, the present method and apparatus for the solderless electrical connection of two contact elements by using a laser light beam attached to a fiber optic system is applicable to bonding other types of electrical members to each other. Likewise, while the present invention was described in conjunction with solderless gold to gold bonding of electrical members to each other, the present method could be used for the solderless bonding of other conductive metals. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of forming an electrical connection between a TAB circuit and electrical contact bumps, the TAB circuit including a polymeric base and electrical leads formed on the polymeric base, said method comprising the steps of:
   aligning the electrical leads of the TAB circuit with the electrical contact bumps;
   holding the electrical leads and the electrical contact bumps in contact at a bond surface; and
   bonding the electrical leads and the electrical contact bumps at the bond surface by directing a laser beam to propagate through the polymeric base of the TAB circuit to heat the electrical leads.

2. The method of claim 1 wherein:
   the holding step comprises pressing the electrical leads and the electrical contact bumps together with an optical fiber; and
   the bonding step comprises directing the laser beam through the optical fiber to the polymeric base.

3. The method of claim 1, further comprising the steps of, before the aligning step:
   forming the electrical contact bumps on a component of a thermal-ink jet printhead; and
   forming nozzles of said printhead through said polymeric base.

4. A method of forming an electrical connection between a TAB circuit and electrical contact bumps, the TAB circuit including a polymeric base and electrical leads formed on the polymeric base, said method comprising the steps of:
   forming a chromium seed-metal layer on the polymeric base of the TAB circuit;
   forming the electrical leads on the chromium seed-metal layer;
   aligning the electrical leads of the TAB circuit with the electrical contact bumps; and
   bonding the electrical leads and the electrical contact bumps at the bond surface by directing a laser beam through the polymeric base of the TAB circuit for absorption by the chromium seed-metal layer to heat the electrical leads.

5. The method of claim 4, wherein:

the electrical-lead forming step comprises forming copper leads on the seed metal layer.

6. The method of claim 5:

further comprising the step of forming the electrical contact bumps of gold, on a die; and wherein the electrical-lead forming step further comprises forming gold contacts on the copper leads.

7. The method of claim 4, wherein:

said bonding step comprises producing a bond of shear strength exceeding two hundred grams.

8. The method of claim 4, wherein:

said bonding step comprises before and during said directing of said laser beam, holding the electrical leads and the electrical contact bumps together with a force exceeding three hundred grams.

9. The method of claim 4, further comprising the steps of, before the aligning step:

forming the electrical contact bumps on a component of a thermal-ink jet printhead; and forming nozzles of said printhead through said polymeric base.

* * * * *

UNITED STATES PATENT AND TRADEMARK OFFICE
CERTIFICATE OF CORRECTION

PATENT NO. : 6,983,539 B2  Page 1 of 1
APPLICATION NO. : 10/161472
DATED : January 10, 2006
INVENTOR(S) : Mohammad Akhavain et al.

It is certified that error appears in the above-identified patent and that said Letters Patent is hereby corrected as shown below:

On the Title page, in field (63), under "Related U.S. Application Data", column 1, line 1, delete "Continuation" and insert -- Divisional --, therefor.

In column 8, line 16, delete "YANG" and insert -- YAG --, therefor.

In column 9, line 58, delete "fill" and insert -- full --, therefor.

Signed and Sealed this

Ninth Day of June, 2009

JOHN DOLL
*Acting Director of the United States Patent and Trademark Office*